US011069794B2

(12) United States Patent
Li et al.

(10) Patent No.: US 11,069,794 B2
(45) Date of Patent: Jul. 20, 2021

(54) TRENCH POWER TRANSISTOR AND METHOD OF PRODUCING THE SAME

(71) Applicant: Leadpower-semi CO., LTD., Zhubei (TW)

(72) Inventors: Po-Hsien Li, Taipei (TW); Jen-Hao Yeh, Zhubei (TW); Hsin-Yen Chiu, Taichung (TW)

(73) Assignee: Leadpower-semi Co., LTD., Zhubei (TW)

( * ) Notice: Subject to any disclaimer, the term of this patent is extended or adjusted under 35 U.S.C. 154(b) by 0 days.

(21) Appl. No.: 16/580,244

(22) Filed: Sep. 24, 2019

(65) Prior Publication Data

US 2020/0227537 A1 Jul. 16, 2020

(30) Foreign Application Priority Data

Jan. 11, 2019 (TW) .................................. 108101121

(51) Int. Cl.
*H01L 29/66* (2006.01)
*H01L 29/423* (2006.01)
*H01L 21/3065* (2006.01)
*H01L 29/78* (2006.01)
*H01L 29/16* (2006.01)
(Continued)

(52) U.S. Cl.
CPC ...... *H01L 29/66734* (2013.01); *H01L 21/022* (2013.01); *H01L 21/0228* (2013.01); *H01L 21/02164* (2013.01); *H01L 21/26506* (2013.01); *H01L 21/3065* (2013.01); *H01L 29/16* (2013.01); *H01L 29/407* (2013.01); *H01L 29/4236* (2013.01); *H01L 29/7813* (2013.01)

(58) Field of Classification Search
None
See application file for complete search history.

(56) References Cited

U.S. PATENT DOCUMENTS 7,732,842 B2 * 6/2010 Session ............... H01L 29/7806
257/284
8,497,549 B2 * 7/2013 Madson ............... H01L 29/7813
257/330

(Continued)

OTHER PUBLICATIONS

Search Report appended to an Office Action, which was issued to Taiwanese counterpart application No. 108101121 by the TIPO dated Oct. 5, 2019.

*Primary Examiner* — Dale E Page
*Assistant Examiner* — Wilner Jean Baptiste
(74) *Attorney, Agent, or Firm* — Allen, Dyer, Doppelt + Gilchrist, PA (57) ABSTRACT

A transistor production method includes etching a semiconductor substrate to form at least one upper trench portion, sequentially depositing first and second insulating materials over the substrate and partially removing the second insulating material, etching the substrate to form a lower trench portion, depositing a third insulating material over the substrate, disposing a polycrystalline silicon (pc-Si) material in the trench portions and partially removing such material, depositing a fourth insulating material over the substrate and partially removing the third and fourth insulating materials, removing the second insulating material and disposing another pc-Si material in the upper trench portion, and forming a well and a source on the substrate. A trench power transistor thus produced is also disclosed.

6 Claims, 8 Drawing Sheets

(51) Int. Cl.
*H01L 21/02* (2006.01)
*H01L 29/40* (2006.01)
*H01L 21/265* (2006.01)

(56) References Cited

U.S. PATENT DOCUMENTS 9,799,743 B1 10/2017 Li et al.
2009/0090966 A1* 4/2009 Thorup ............. H01L 29/66734
257/328

* cited by examiner

TRENCH POWER TRANSISTOR AND METHOD OF PRODUCING THE SAME

CROSS-REFERENCE TO RELATED APPLICATION

This application claims priority of Taiwanese Patent Application No. 108101121, filed on Jan. 11, 2019.

FIELD

The disclosure relates to a power transistor and a production method thereof, and more particularly to a trench power transistor and a production method thereof.

BACKGROUND

Power transistors can be applied to digital circuits and analog circuits, and hence are widely applicable power components. Power transistors can be categorized into horizontal and vertical power transistors based on the current flow path. Common vertical power transistors include trench gate metal-oxide-semiconductor field-effect transistors (trench gate MOSFETs or UMOSFETs), V-groove MOSFETs (VMOSFETs), and vertical double-diffused MOSFETs (VDMOSFETs). Further, since the U-shaped trench of trench gate MOSFETs can effectively reduce the on-state resistance and improve the edge termination characteristics of transistors, trench gate MOSFETs may serve as promising high-frequency low-voltage power components.

However, conventional trench power transistors such as trench gate MOSFETs, when operated in the blocking mode, are required to support all the forward blocking voltage across the drift region (e.g. an N-type drift layer). Therefore, in order to support a higher forward blocking voltage, it is necessary to reduce the doping concentration in the drift region. As a trade-off for such reduction, the on-state resistance is increased, which is unfavorable to the component characteristics. In addition, since the gate electrode in the trench of conventional trench power transistors is unsatisfactorily large in volume, the gate-to-drain capacitance ($C_{GD}$) is unsatisfactorily large, and the operation of conventional trench power transistors at high frequency is limited.

Figure 1:
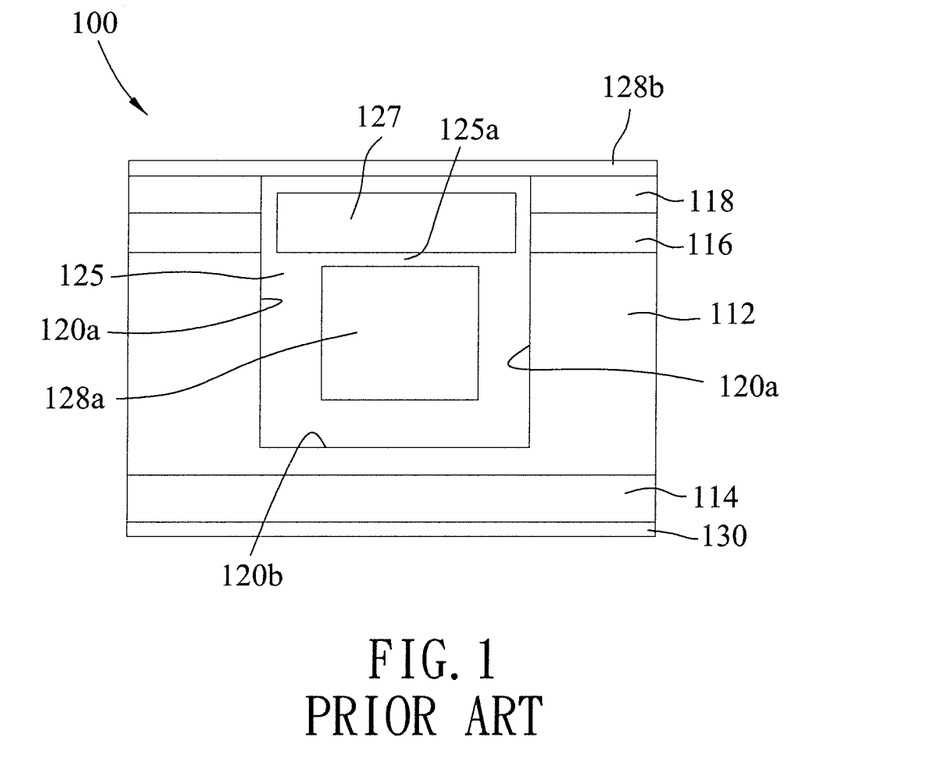
FIG. 1 is a schematic sectional view of a conventional trench power transistor.

Referring to FIG. 1, a conventional trench power transistor having improved high frequency switching and breakdown characteristics, as disclosed in U.S. Pat. No. 5,998,833, is illustrated. Each unit cell 100 of the trench power transistor includes a first-type doped drain layer 114 that has a high doping concentration (e.g. $N^+$ doping), a first-type doped drift layer 112, a second-type doped (e.g. P-type doped) base layer 116 that is formed on the drift layer 112, a source layer 118 that has a high doping concentration, a source electrode 128b and a drain electrode 130 that are in ohmic contact respectively with the source layer 118 and the drain layer 114, and a trench electrode structure. The trench electrode structure has a trench that is defined by two opposing sidewalls 120a and a bottom 120b. The trench electrode structure includes a gate electrode 127, a trench-based source electrode 128a, and an oxide insulating layer 125 that has an insulating region 125a disposed between the gate electrode 127 and the trench-based source electrode 128a. Basically, the trench-based source electrode 128a is used to replace a part of the gate electrode 127 to reduce the $C_{GD}$ for decreasing the interference current and gate charge generated during the operation of the trench power transistor at high frequency, so that the breakdown voltage and the switching speed of the trench power transistor at high frequency can be improved without sacrificing the on-state resistance. However, the aforesaid intended effects are still unsatisfactory.

SUMMARY

Therefore, an object of the disclosure is to provide a trench power transistor and a production method thereof that can alleviate at least one of the drawbacks of the prior art.

The method for producing a trench power transistor includes steps (a) to (h). In step (a), a semiconductor substrate having a first surface and a second surface opposite to each other is provided, and the semiconductor substrate is etched to form at least one upper trench portion that is recessed from the first surface and that is defined by an upper surrounding wall and an upper bottom wall. In step (b), a first insulating material is deposited over the first surface and the upper surrounding and bottom walls of the upper trench portion, a second insulating material is deposited over the first insulating material, and the second insulating material is partially removed so that a portion of the first insulating material overlaying the upper bottom wall of the upper trench portion is exposed, and so that a portion of the first insulating material overlaying the first surface is exposed. The first and second insulating materials are different in material, and the second insulating material is a nitride material. In step (c), the semiconductor substrate is etched so that the portion of the first insulating material overlaying the upper bottom wall of the upper trench portion is removed, and so that a lower trench portion in spatial communication with the upper trench portion is formed. The lower trench portion is recessed from the upper surrounding wall of the upper trench portion, and is defined by a lower surrounding wall and a lower bottom wall. The upper and lower trench portions cooperate to define an electrode trench. In step (d), a third insulating material is deposited over the portion of the first insulating material overlaying the first surface, the second insulating material in the upper trench portion, and the lower surrounding wall and the lower bottom wall of the lower trench portion. The second and third insulating materials are different in material. In step (e), a polycrystalline silicon material is disposed in the upper and lower trench portions of the electrode trench, and the polycrystalline silicon material is partially removed so that a remaining portion of the polycrystalline silicon material is retained in the lower trench portion of the electrode trench to serve as a shield electrode having an upper end proximal to the upper trench portion of the electrode trench. In step (f), a fourth insulating material is deposited over the third insulating material covering the portion of the first insulating material overlaying the first surface, as well as the electrode trench, and the third and fourth insulating materials are partially removed so that the portion of the first insulating material overlaying the first surface is exposed, so that the second insulating material in the upper trench portion of the electrode trench is exposed, and so that a remaining portion of the fourth insulating material is retained in the electrode trench and on the upper end of the shield electrode to cooperate with a remaining portion of the third insulating layer for enclosing the shield electrode. In step (g), the second insulating material in the upper trench portion of the electrode trench is removed so that a portion of the first insulating material in the upper trench portion of the electrode trench is exposed, and another polycrystalline silicon material is disposed in the upper trench portion of the electrode trench so that the another polycrystalline silicon material is surrounded by the portion of the first insulating material in the upper trench portion of the electrode trench and serves as a gate electrode. In step (h), through ion implantation, a well is formed adjacent to the electrode trench, and a source is formed in the well. The well extends downwardly from the first surface.

The trench power transistor includes a semiconductor body that has a first surface and a second surface opposite to each other, and that includes at least one active region (3A). The active region includes a trench electrode structure, a well, and a source. The trench electrode structure has an electrode trench that is recessed from the first surface, and that has a bottom wall, a lower surrounding wall extending upwardly from the bottom wall, and an upper surrounding wall extending upwardly from the lower surrounding wall to the first surface. The electrode trench has a lower trench portion that is defined by the bottom wall and the lower surrounding wall, and an upper trench portion that is defined by the upper surrounding wall. The trench electrode structure includes an insulating layer, a shield electrode, and a gate electrode. The insulating layer is disposed over the bottom wall and the upper and lower surrounding walls. The shield electrode is disposed in the lower trench portion and is enclosed by the insulating layer. The gate electrode is disposed in the upper trench portion, and is surrounded by the insulating layer to be separated from the shield electrode. The well is formed adjacent to the electrode trench of the trench electrode structure, and extends downwardly from the first surface. The source is formed in the well.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Before the disclosure is described in greater detail, it should be noted that like elements are denoted by the same reference numerals throughout the disclosure.

Figure 2:
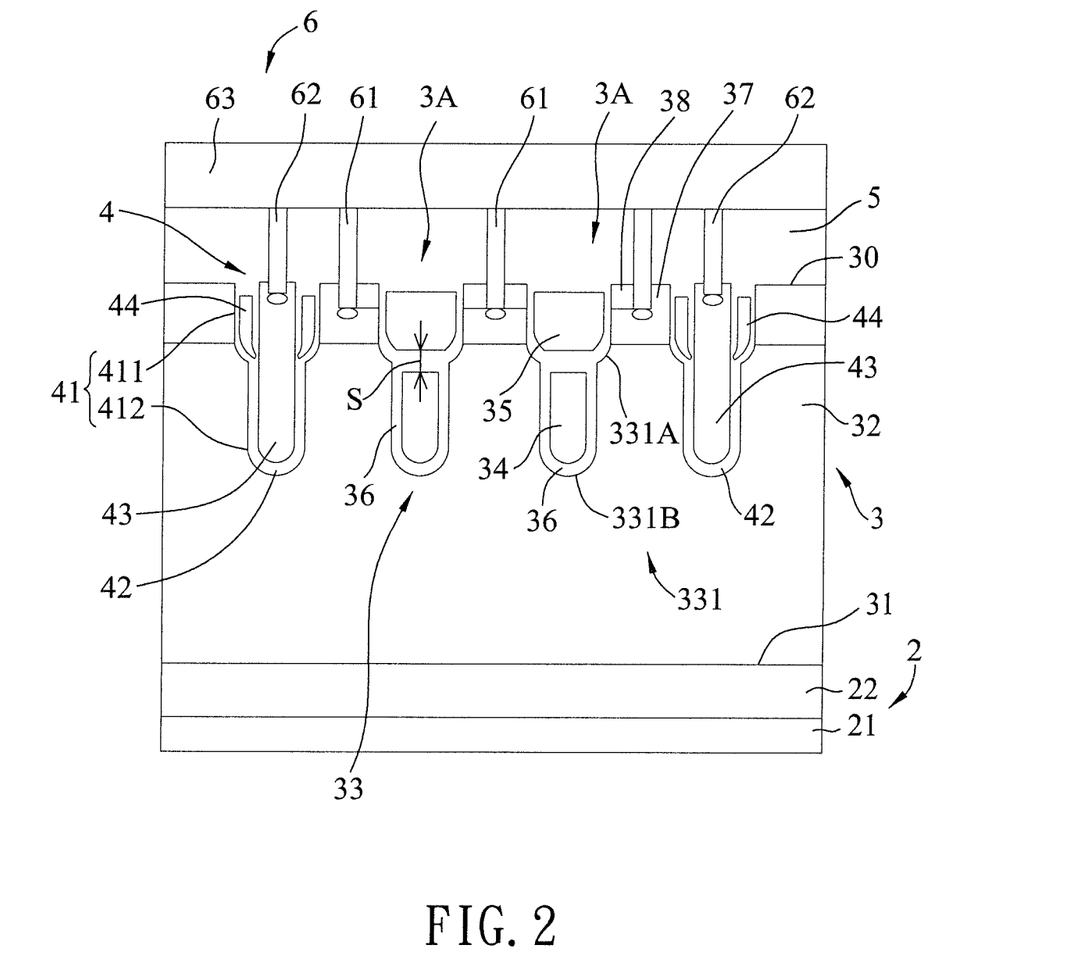
FIG. 2 is a schematic sectional view of a first embodiment of a trench power transistor according to the present disclosure.
Figure 3:
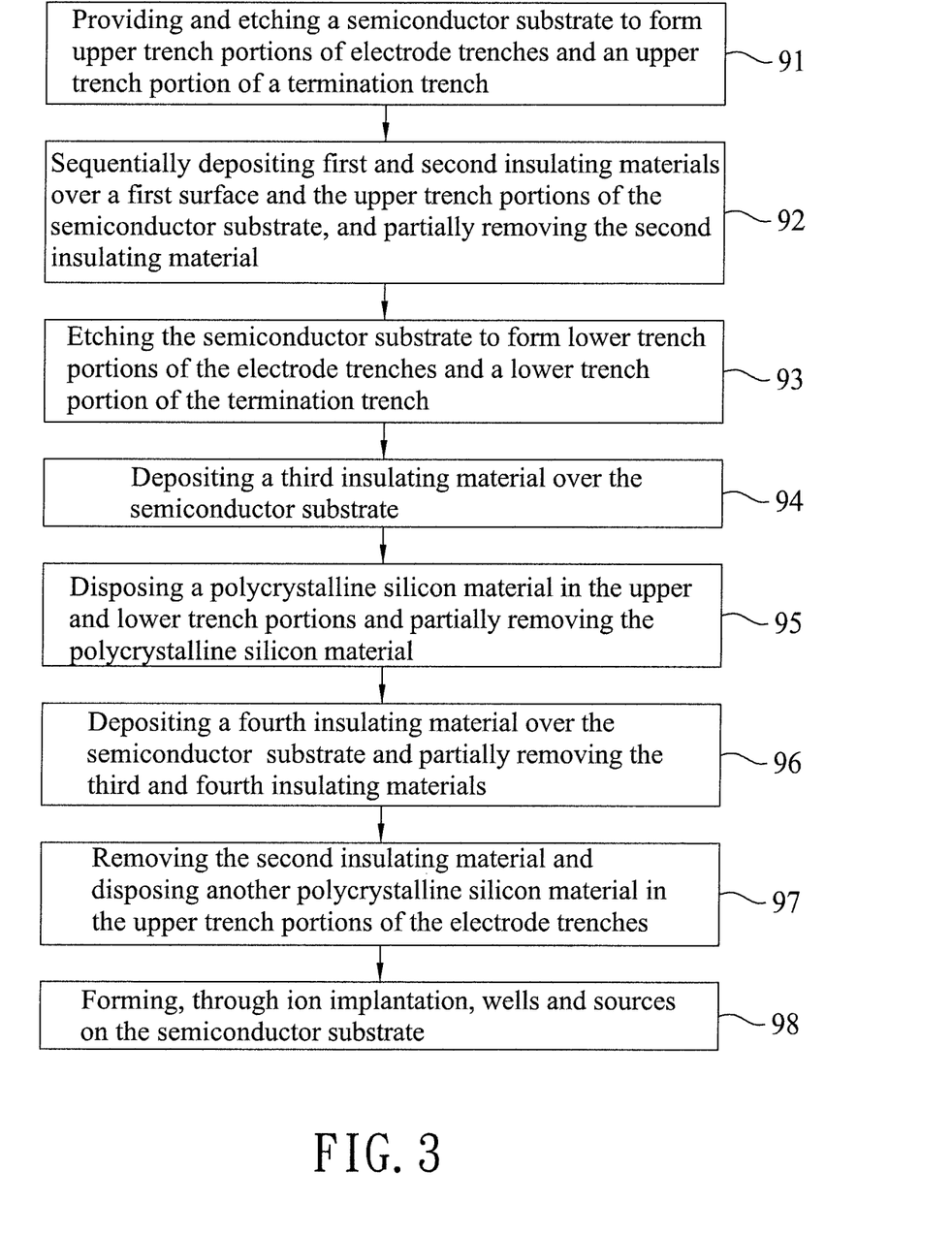
FIG. 3 is a flow chart illustrating an embodiment of a method for producing a trench power transistor according to the present disclosure.

Referring to FIG. 2, a first embodiment of a trench power transistor according to the present disclosure includes a substrate 2, a semiconductor body 3, an insulation layer 5, and an electrically conducting unit 6.

The semiconductor body 3 has a first surface 30 and a second surface 31 opposite to each other. The insulation layer 5 and the substrate 2 are respectively disposed on the first and second surfaces 30, 31 of the semiconductor body 3. The electrically conducting unit 6 is disposed on the insulation layer 5 opposite to the substrate 2.

The substrate 2 includes a drain electrode 21 and a first-type doped drain layer 22 that is disposed between the second surface 31 of the semiconductor body 3 and the drain electrode 21, that is in ohmic contact with the drain electrode 21, that is made of a semiconductor material, and that has a doping concentration higher than $10^{19}$ cm$^{-3}$ at least.

The semiconductor body 3 (the second surface 31 of which is covered by the drain layer 22) includes a first-type doped drift zone 32 that extends upwardly from the second surface 31 to the first surface 30, and that has a doping concentration less than that of the drain layer 22, and at least one active region 3A that is formed in the drift zone 32. In this embodiment, the semiconductor body 3 includes a plurality of the active regions 3A (two of the active regions 3A formed adjacent to each other are shown in FIG. 2).

The term "first-type doped" refers to being doped with a first conductivity type dopant, and the term "second-type doped" refers to being doped with a second conductivity type dopant that is opposite in conductivity type to the first conductivity type dopant. For instance, the first conductivity type dopant may be an n-type dopant, and the second conductivity type dopant may be a p-type dopant, and vice versa. The trench power transistor of the present disclosure may be used as an n-channel metal-oxide semiconductor (NMOS) transistor or a p-channel metal-oxide semiconductor (PMOS) transistor.

Each of the active regions 3A includes a trench electrode structure 33, a second-type doped well 37, and a first-type doped source 38. The source 38 has a doping concentration higher than $10^{19}$ cm$^{-3}$ at least.

The trench electrode structure 33 has an electrode trench 331 that is recessed from the first surface 30 to be formed in the drift zone 32, and that has a bottom wall, a lower surrounding wall extending upwardly from the bottom wall, and an upper surrounding wall extending upwardly from the lower surrounding wall to the first surface 30. The electrode trench 331 has a lower trench portion 331B that is defined by the bottom wall and the lower surrounding wall, and an upper trench portion 331A that is defined by the upper surrounding wall. The upper and lower trench portions 331A, 331B are different in width.

The trench electrode structure 33 includes an insulating layer 36, a shield electrode 34, and a gate electrode 35. The insulating layer 36 is disposed over the bottom wall and the upper and lower surrounding walls of the electrode trench 331. The shield electrode 34 is disposed in the lower trench portion 331B and is enclosed by the insulating layer 36. The gate electrode 35 is disposed in the upper trench portion 331A, is surrounded by the insulating layer 36 to be separated from the shield electrode 34, and has a top face that is covered by the insulation layer 5. The gate electrode 35 is apart from the shield electrode 34 by a distance (S) which may range from 1000 Å to 4000 Å.

The insulating layer 36 may be made of an oxide material. In this embodiment, the insulating layer 36 is made of a silicon oxide material.

Each of the wells 37 is formed adjacent to the upper trench portion 331A of the electrode trench 331 of the corresponding one of the trench electrode structures 33, and extends downwardly from the first surface 30.

Each of the sources 38 is formed in a corresponding one of the wells 37.

The semiconductor body 3 further includes a trench edge termination structure 4 that surrounds the active regions 3A. It should be noted that even though two sectional representations of the trench edge termination structure 4 are shown in FIG. 2, they together represent the trench edge termination structure 4 which is in an annular form (e.g. a circular form, a quadrilateral form, or other loop form) for surrounding the active regions 3A.

The trench edge termination structure 4 has a termination trench 41 that is recessed from the first surface 30, and that has a bottom wall, a lower surrounding wall extending upwardly from the bottom wall of the termination trench 41, and an upper surrounding wall extending upwardly from the lower surrounding wall of the termination trench 41 to the first surface 30 (please note that two sectional representations of the termination trench in an annular form are shown in FIG. 2). The termination trench 41 has a lower trench portion 412 that is defined by the bottom wall and the lower surrounding wall of the termination trench 41, and an upper trench portion 411 that is defined by the upper surrounding wall of the termination trench 41. The upper and lower trench portions 411, 412 of the termination trench 41 are different in width.

The trench edge termination structure 4 includes an insulator layer 42, an electrically conductive member 43, and a nitride layer 44. The insulator layer 42 is disposed over the bottom wall and the upper and lower surrounding walls of the termination trench 41. The electrically conductive member 43 is disposed at least in the lower trench portion 412 of the termination trench 41, and is surrounded by the insulator layer 42. In this embodiment, the electrically conductive member 43 is disposed in both of the upper and lower trench portions 411, 412. The nitride layer 44 is disposed in the upper trench portion 411 of the termination trench 41, and is surrounded by the insulator layer 42 to be separated from the electrically conductive member 43.

It should be noted that the depth of the electrode trenches 331, as well as the thickness of the insulating materials for forming the insulating layer 36, may vary with the desired voltage withstanding capability of the trench power transistor. Since suitable insulating materials (for example, high dielectric insulating materials suitable for semiconductors such as $Si_3N_4$, $Al_2O_3$, $Y_2O_3$, $TiO_2$, $HfO_2$, $ZrO_2$, and so forth, or $SiO_2$) and correlation of the trench depth and insulating material thickness with the voltage withstanding capability of the trench power transistor are known in the art, detailed description thereof is omitted herein for the sake of brevity.

Each of the electrode trenches 331 is formed by two etching processes to have the upper trench portion 331A and the lower trench portion 331B. Therefore, a desired depth to be formed through a respective one of the etching processes (i.e. a depth of the upper trench portion 331A or the lower trench portion 331B) may vary with the actual need and design, as long as a total depth of the electrode trenches 331 can achieve the desired characteristics of the trench power transistor.

The depth of the upper trench portions 331A of the electrode trenches 331, as well as the depth of the upper trench portion 411 of the termination trench 41, may range from 0.5 μm to 1.5 μm. The depth of the lower trench portions 331B of the electrode trenches 331, as well as the depth of the lower trench portion 412 of the termination trench 41, may range from 1 μm to 10 μm.

In this embodiment, the lower trench portion 331B of each of the electrode trenches 331 has a width smaller than that of the upper trench portion 331A of the corresponding one of the electrode trenches 331, and the lower trench portion 412 of the termination trench 41 has a width smaller than that of the upper trench portion 411 of the termination trench 41. Nevertheless, in other embodiment, the lower trench portion 331B of each of the electrode trenches 331 may have a width larger than that of the upper trench portion 331A of the corresponding one of the electrode trenches 331, and the lower trench portion 412 of the termination trench 41 may have a width larger than that of the upper trench portion 411 of the termination trench 41.

The insulation layer 5 covers the first surface 30, the electrode trenches 331, and the termination trench 41 of the semiconductor body 3. The insulation layer 5 is made of an insulation material having a low dielectric constant, for instance, phosphosilicate glass (PSG) and borophosphosilicate glass (BPSG).

The electrically conducting unit 6 provides external electrical connection for the active regions 3A and the trench edge termination structure 4 through a three-dimensional wiring structure. The electrically conducting unit 6 includes at least one source conducting plug 61, at least one gate electrode conducting plug (not shown), at least one edge termination conducting plug 62, and an electrically conducting layer 63. In this embodiment, three of the source conducting plugs 61, two of the gate electrode conducting plugs, and two of the edge termination conducting plugs 62 are provided. Each of the source conducting plugs 61 extends through the insulation layer 5 to be in ohmic contact with a corresponding one of the sources 38 of the active regions 3A. Each of the gate electrode conducting plugs is disposed to be in ohmic contact with a corresponding one of the gate electrodes 35 of the active regions 3A. Each of the edge termination conducting plugs 62 extends through the insulation layer 5 to be in ohmic contact with the electrically conductive member 43 of the trench edge termination structure 4. The electrically conducting layer 63 is formed on the insulation layer 5 opposite to the semiconductor body 3, and provides electrical connection for a respective one of the source conducting plugs 61, the gate electrode conducting plugs, and the edge termination conducting plugs 62.

Figure 12:
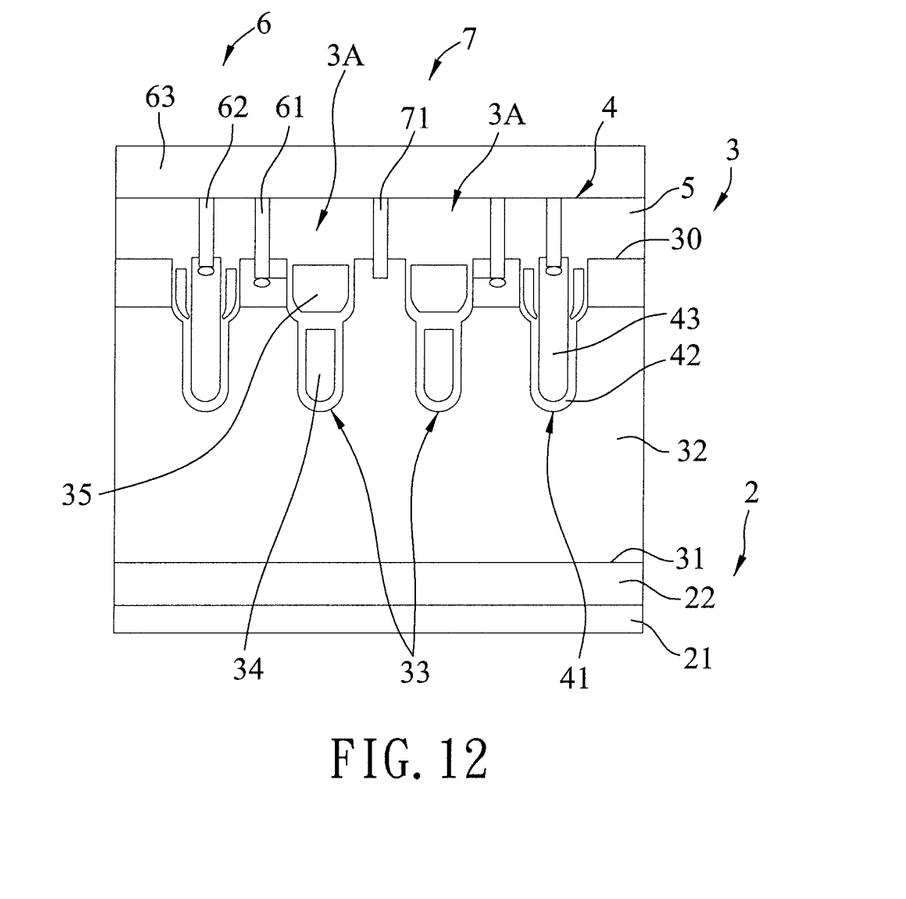
FIG. 12 is a schematic sectional view of a second embodiment of the trench power transistor according to the present disclosure.

Referring to FIG. 12, a second embodiment of the trench power transistor is similar to the first embodiment, except that the semiconductor body 3 further includes a rectifier structure 7 disposed between the two adjacent active regions 3A, and that the well 37 and the source 38 disposed between the two adjacent active regions 3A as shown in FIG. 2, as well as the source conducting plug 61 in ohmic contact with such source 38 as shown in FIG. 2, are replaced by the rectifier structure 7. It should be noted that the rectifier structure 7 may be integrated into the trench power transistor as illustrated in FIG. 12, or may be a trench MOS barrier Schottky rectifier (TMBS). The rectifier structure 7, for integration into the trench power transistor, includes a Schottky conductive plug 71 that is in Schottky contact with the drift zone 32 of the semiconductor body 3, and that is provided with external electrical connection by the electrically conducting layer 63. The rectifier structure 7 can reduce power consumption because of low forward voltage and also provide a fast recovery when switching off.

The present disclosure also provides a method for producing a trench power transistor. A first embodiment of the method, which is for producing the first embodiment of the trench power transistor, is illustrated in FIGS. 3 to 11. The first embodiment of the method comprises steps 91 to 98.

Figure 4:
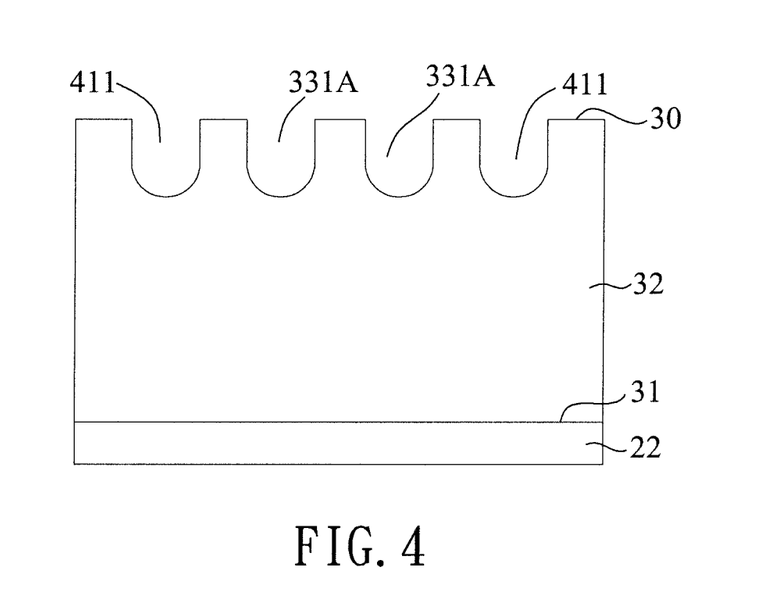
FIG. 4 is a schematic sectional view illustrating a structure formed after step 91 of the embodiment of the method is conducted.

In step 91, a semiconductor substrate is provided. The semiconductor substrate has the opposite first and second surfaces 30, 31 and the drift zone 32 described above. The drain layer 22 described above is disposed on the second surface 31 of the semiconductor substrate. The drain layer 22 and the drift zone 32 are formed by virtue of a semiconductor epitaxial growth process and an ion implantation process. Furthermore, in step 91, the semiconductor substrate is etched (e.g. through dry etching) to form the upper trench portions 331A of the electrode trenches 331 and the upper trench portion 411 of the termination trench 41. The upper trench portion 411 of the termination trench 41 surrounds the upper trench portions 331A of the electrode trenches 331. Each of the upper trench portions 331A is recessed from the first surface 30, and is defined by an upper surrounding wall (i.e. the upper surrounding wall of a corresponding one of the electrode trenches 331) and an upper bottom wall. The upper trench portion 411 is recessed from the first surface 30, and is defined by an upper surrounding wall (i.e. the upper surrounding wall of the termination trench 41) and an upper bottom wall. After step 91 is conducted, a structure shown in FIG. 4 is obtained.

Figure 5:
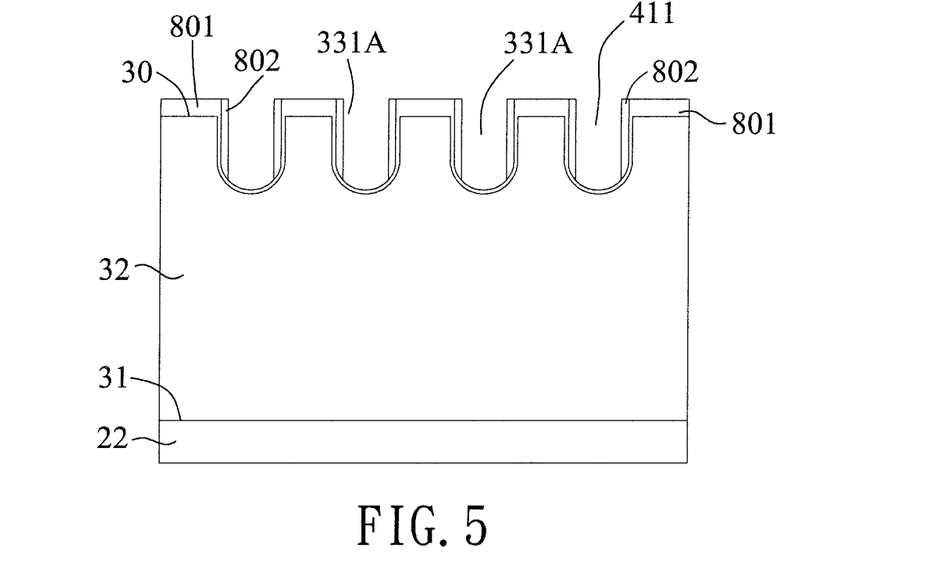
FIG. 5 is a schematic sectional view illustrating a structure formed after step 92 of the embodiment of the method is conducted.

In step 92, a first insulating material 801 is deposited over the first surface 30, the upper surrounding and bottom walls of each of the upper trench portions 331A of the electrode trenches 331, and the upper surrounding and bottom walls of the upper trench portion 411 of the termination trench 41. Moreover, in step 92, a second insulating material 802 is deposited over the first insulating material 801, and the second insulating material 802 is partially removed (e.g. via dry etching) so that a portion of the first insulating material 801 overlaying the upper bottom wall of a respective one of the upper trench portions 331A of the electrode trenches 331 is exposed, so that a portion of the first insulating material 801 overlaying the upper bottom wall of the upper trench portion 411 of the termination trench 41 is exposed, and so that a portion of the first insulating material 801 overlaying the first surface 30 is exposed. The first insulating material 801 is intended to from a part of the insulating layer 36 and a part of the insulator layer 42, and the second insulating material 802 is intended to form the nitride layer 44. After step 92 is conducted, a structure shown in FIG. 5 is obtained.

The first and second insulating materials 801, 802 are different materials. The second insulating material 802 may be a nitride material that can protect the first insulating material 801. In this embodiment, the first insulating material 801 is a silicon oxide material, and the second insulating material 802 is a silicon nitride material.

A thickness of the first insulating material 801 may approximately range from 160 Å to 1000 Å, and a thickness of the second insulating material 802 may approximately range from 250 Å to 500 Å.

Figure 6:
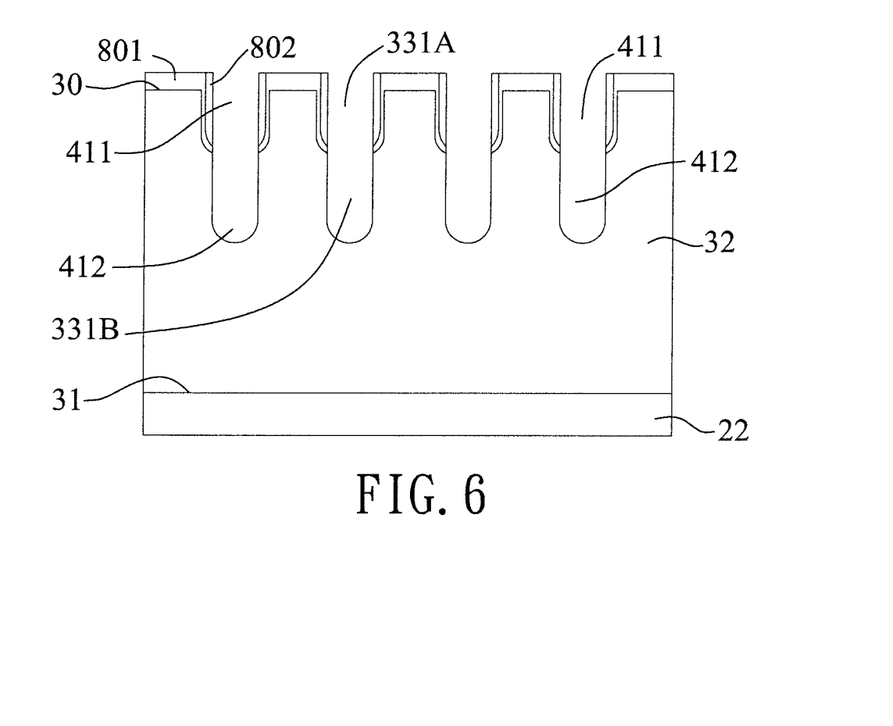
FIG. 6 is a schematic sectional view illustrating a structure formed after step 93 of the embodiment of the method is conducted.

In step 93, the semiconductor substrate is etched (e.g. by virtue of dry etching) so that: the portion of the first insulating material 801 overlaying the upper bottom wall of a respective one of the upper trench portions 331A of the electrode trenches 331, as well as the portion of the first insulating material 801 overlaying the upper bottom wall of the upper trench portion 411 of the termination trench 41, is removed; and the lower trench portions 331B respectively in spatial communication with the upper trench portions 331A, as well as the lower trench portion 412 in spatial communication with the upper trench portion 411, are formed. The lower trench portion 412 of the termination trench 41 surrounds the lower trench portions 331B of the electrode trenches 311. Each of the lower trench portions 331B is recessed from the upper surrounding wall of the corresponding one of the upper trench portions 331A (i.e. each of the lower trench portions 331B is formed by etching the upper bottom wall of the corresponding one of the upper trench portions 331A downwardly towards the drift zone 32), and is defined by a lower surrounding wall (i.e. the lower surrounding wall of the corresponding one of the electrode trenches 331) and a lower bottom wall (i.e. the bottom wall of the corresponding one of the electrode trenches 331). The lower trench portion 412 is recessed from the upper surrounding wall of the upper trench portion 411 (i.e. the lower trench portion 412 is formed by etching the upper bottom wall of the upper trench portion 411 downwardly towards the drift zone 32), and is defined by a lower surrounding wall (i.e. the lower surrounding wall of the termination trench 41) and a lower bottom wall (i.e. the bottom wall of the termination trench 41). After step 93 is conducted, a structure shown in FIG. 6 is obtained.

Figure 7:
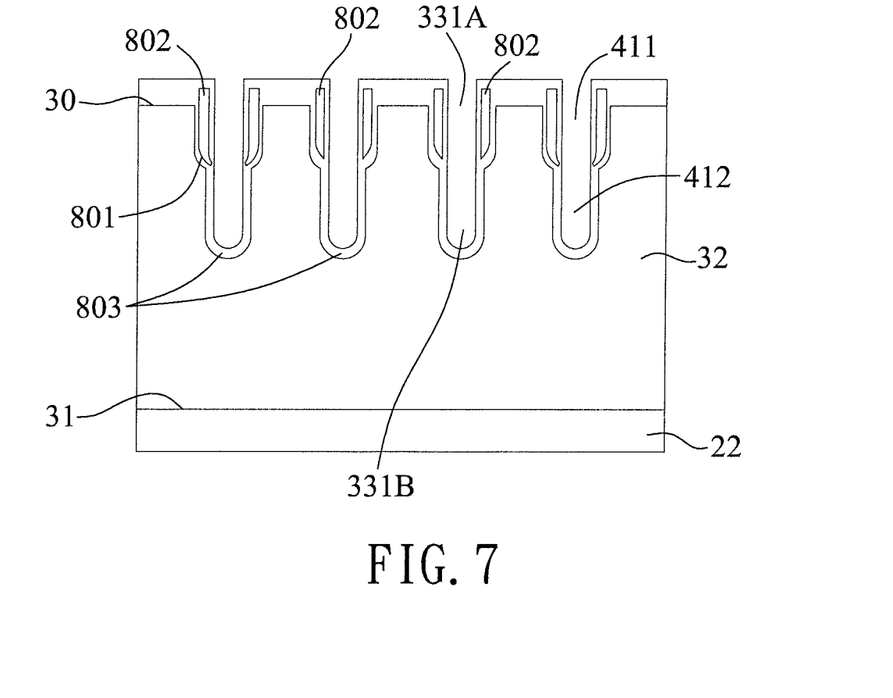
FIG. 7 is a schematic sectional view illustrating a structure formed after step 94 of the embodiment of the method is conducted.

In step 94, a third insulating material 803 is deposited over the following: the portion of the first insulating material 801 overlaying the first surface 30; the second insulating material 802 in the upper trench portion 331A of each of the electrode trenches 331; the lower surrounding and bottom walls of the lower trench portion 331B of each of the electrode trenches 331; the second insulating material 802 in the upper trench portion 411 of the termination trench 41; and the lower surrounding and bottom walls of the lower trench portion 412 of the termination trench 41. The third insulating material 803 is intended to form a part of the insulating layer 36 and a part of the insulator layer 42. The second and third insulating materials 802, 803 are different materials. The third insulating material 803 is deposited through a low-pressure chemical vapor deposition process conducted at a temperature not higher than 750° C. In this embodiment, the low-pressure chemical vapor deposition process is conducted at a temperature ranging from 650° C. to 750° C. using tetraethyl orthosilicate (TEOS) as a reaction gas, and the third insulating material 803 is a silicon oxide material and has a thickness ranging from 600 Å to 12000 Å. After step 94 is conducted, a structure shown in FIG. 7 is obtained.

Figure 8:
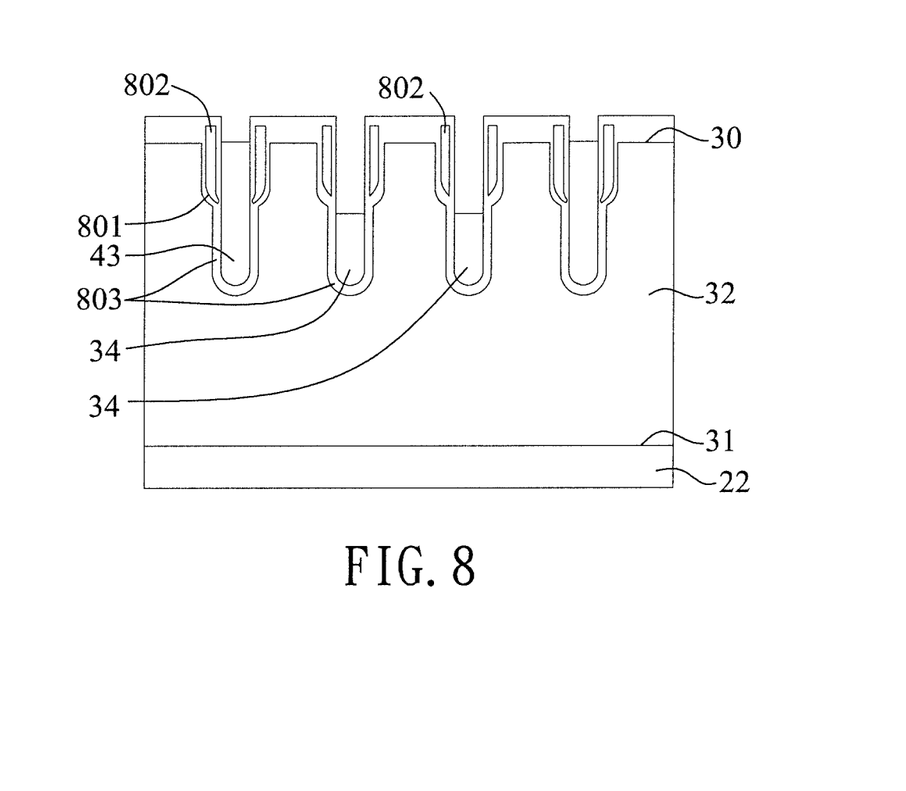
FIG. 8 is a schematic sectional view illustrating a structure formed after step 95 of the embodiment of the method is conducted.

In step 95, a polycrystalline silicon material is disposed in the upper and lower trench portions 331A, 331B of each of the electrode trenches 331, and in the upper and lower trench portions 411, 412 of the termination trench 41. Furthermore, in step 95, the polycrystalline silicon material in each of the electrode trenches 331 is partially removed (e.g. through etching) so that a remaining portion of the polycrystalline silicon material is retained in the lower trench portion 331B of a respective one of the electrode trenches 331 to serve as a shield electrode 34. When the partial removal of the polycrystalline silicon material in each of the electrode trenches 331 is conducted via etching, a mask is used to protect the polycrystalline silicon material in the upper and lower trench portions 411, 412 of the termination trench 41 (the mask is removed after the etching). The shield electrode 34 has an upper end proximal to the upper trench portion 331A. In this embodiment, the upper end of the shield electrode 34 is apart from the upper trench portion 331A by a predetermined distance. The polycrystalline silicon material in the upper and lower trench portions 411, 412 of the termination trench 41 serves as the electrically conductive member 43. After step 95 is conducted, a structure shown in FIG. 8 is obtained.

Figure 9:
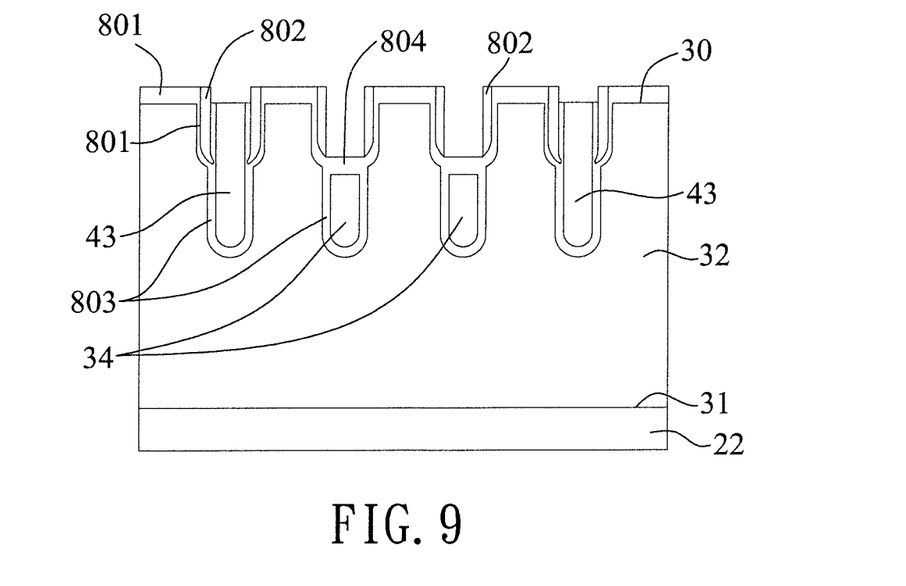
FIG. 9 is a schematic sectional view illustrating a structure formed after step 96 of the embodiment of the method is conducted.

In step 96, a fourth insulating material 804 is deposited over the third insulating material 803 covering the portion of the first insulating material 801 overlaying the first surface 30, as well as the electrode trenches 331 and the termination trench 41. The fourth insulating material 804 is intended to form a part of the insulating layer 36. Moreover, in step 96, the third and fourth insulating materials 803, 804 are partially removed (e.g. through etching) so that: the portion of the first insulating material 801 overlaying the first surface 30 is exposed; the second insulating material 802 in the upper trench portion 331A of each of the electrode trenches 331 is exposed; a remaining portion of the fourth insulating material 804 is retained in the respective one of the electrode trenches 331 and on the upper end of the shield electrode 34 in the respective one of the electrode trenches 331 to cooperate with a remaining portion of the third insulating layer 803 in the corresponding one of the electrode trenches 331 for enclosing the shield electrode 34; the second insulating material 802 in the upper trench portion 411 of the termination trench 41 is partially exposed; and the electrically conductive member 43 and a remaining portion of the third insulating material 803 in the termination trench 41 are partially exposed. The remaining portion of the fourth insulating material 804 in the respective one of the electrode trenches 331 and on the upper end of the shield electrode 34 in the respective one of the electrode trenches 331 (see FIG. 9) has a thickness that is equal to the distance (S) between the gate electrode 35 and the shield electrode 34 (see FIG. 2), and that approximately ranges from 1000 Å to 4000 Å in this embodiment. The fourth insulating material 804 is deposited through a low-pressure chemical vapor deposition process. In this embodiment, the low-pressure chemical vapor deposition process is conducted at a temperature ranging from 650° C. to 750° C. using TEOS as a reaction gas, and the fourth insulating material 804 is a silicon oxide material. After step 96 is conducted, a structure shown in FIG. 9 is obtained.

Figure 10:
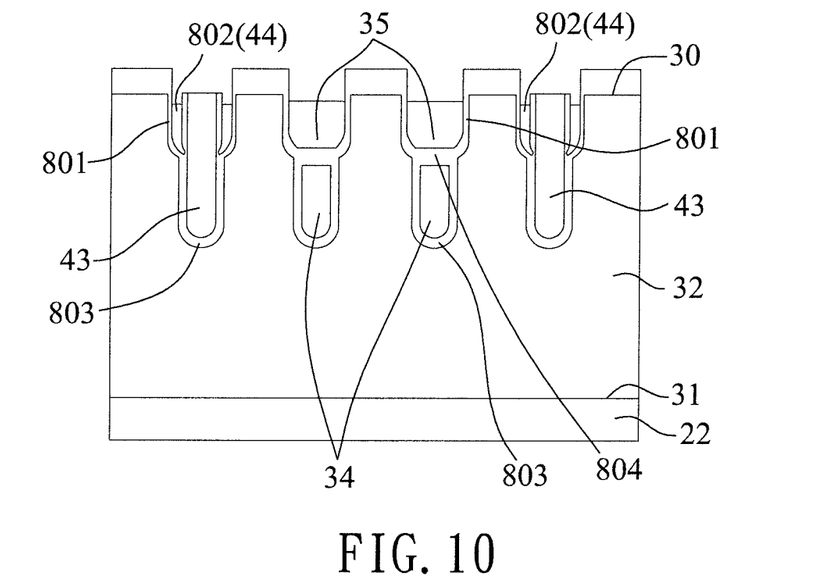
FIG. 10 is a schematic sectional view illustrating a structure formed after step 97 of the embodiment of the method is conducted.
Figure 11:
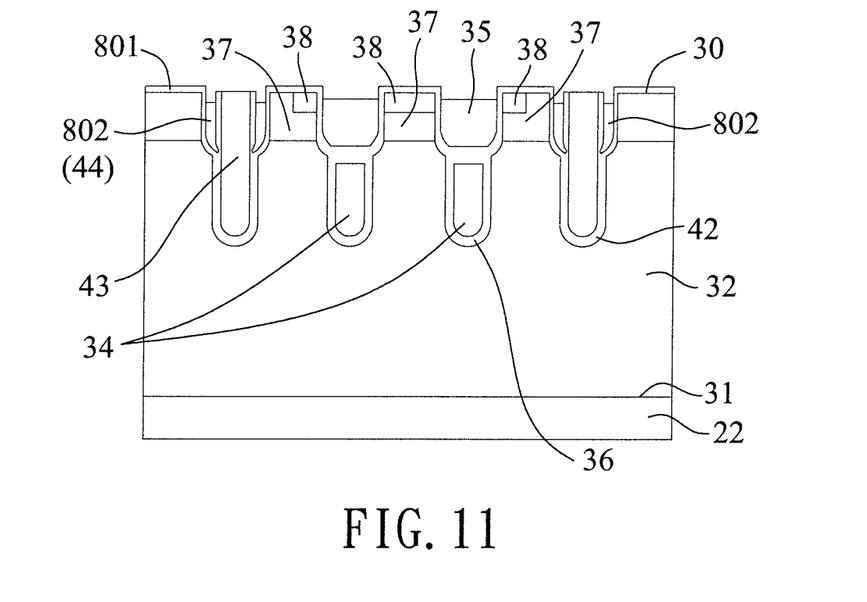
FIG. 11 is a schematic sectional view illustrating a structure formed after step 98 of the embodiment of the method is conducted.

In step 97, the second insulating material 802 in the upper trench portion 331A of each of the electrode trenches 331 is removed (e.g. through etching) so that a portion of the first insulating material 801 in the upper trench portion 331A of each of the electrode trenches 331 is exposed, and the second insulating material 802 in the upper trench portion 411 of the termination trench 41 is partially removed (e.g. through etching) so that a portion of the first insulating material 801 in the upper trench portion 411 of the termination trench 41 is partially exposed. Furthermore, in step 97, another polycrystalline silicon material is disposed in the upper trench portion 331A of each of the electrode trenches 331 so that the another polycrystalline silicon material is surrounded by the portion of the first insulating material 801 in the upper trench portion 331A of the corresponding one of the electrode trenches 331 and serves as the gate electrode 35. After step 97 is conducted, a structure shown in FIG. 10 is obtained. Particularly, the nitride layer and the insulator layer 42 of the trench edge termination structure 4 and the insulating layer 36 of each of the trench electrode structures 33 as shown in FIG. 2 are formed.

In step 98, through ion implantation, each of the wells 37 is formed adjacent to the upper trench portion 331A of the corresponding one of the electrode trenches 331, and the sources 38 are respectively formed in the wells 37. Moreover, the wells 37 and the sources 38 are formed to be surrounded by the termination trench 41. After step 98 is conducted, the active regions 3A as shown in FIG. 2 are formed (i.e. the semiconductor body 3 as shown in FIG. 2 is formed). In addition, in step 98, the insulation layer 5 is formed to cover the first surface 30, the electrode trenches 331, and the termination trench 41 of the semiconductor body 3, and the electrically conducting unit 6 is formed on the insulation layer 5. Specifically, through-holes are formed to extend through the insulation layer 5 so as to respectively correspond in position to the sources 38, the gate electrodes 35 in the electrode trenches 331, and the electrically conductive member 43 in the termination trench 41, and ion implantation and metal deposition are sequentially conducted on the semiconductor body 3 via the through-holes, so that the source conducting plugs 61, the gate electrode conducting plugs, and the edge termination conducting plugs 62 are formed. Lastly, the drain electrode 21 and the electrically conducting layer 63 are formed. After step 98 is completed, the trench power transistor as shown in FIG. 2 is obtained.

The advantages of the trench power transistor and the production method thereof according to the present disclosure are described below.

Even though a nitride material (e.g. silicon nitride) can protect an oxide material (e.g. silicon oxide) during etching and thermal processes and prevent the same from being adversely affected (e.g. damaged) during these and subsequent processes so as to maintain the characteristics of the interface between the trench electrode structure and the drift zone, such nitride material might interact with the gate electrode of the trench electrode structure and hence adversely influence the property of the trench power transistor. Therefore, by virtue of the design that the insulating layer 36 of each of the trench electrode structures 33 is formed through multiple steps in which the second insulating material 802 (i.e. a nitride material) is employed to protect the first insulating material 801 (i.e. an oxide material, e.g. a silicon oxide material) against oxidation during thermal processes, and that the second insulating material 802 can be removed from each of the trench electrodes 331 during the method of the present disclosure to forestall adverse interaction with the gate electrode 35, the quality of the trench power transistor thus produced can be secured. Specifically, due to the removal of the second insulating material 802 from each of the trench electrodes 331, the gate electrode 35 can be prevented from interaction with a nitride material which might induce undesired generation of charges, and the operation performance and reliability of the trench power transistor according to the present disclosure can be ensured.

Since the trench power transistor according to the present disclosure can have satisfactory voltage withstanding capability due to the aforesaid advantage, the doping concentration of the drift zone 32 can be enhanced to reduce the on-state resistance so as to decrease the power consumption during the operation of the trench power transistor.

Referring back to FIG. 1, the conventional trench power transistor having the shield electrode (i.e. the trench-based source electrode 128a), for possessing better characteristics, is required to have less interface trap charges and dielectric trap charges in the insulating region 125a or between the insulating region 125a and the trench-based source electrode 128a. Furthermore, the insulating region 125a, which is between the gate electrode 127 and the trench-based source electrode 128a, is required to have a high quality and a sufficient thickness to withstand the electrical potential difference between the gate electrode 127 and the trench-based source electrode 128a during the operation.

However, in order to form the insulating region 125a having a sufficient thickness to separate the gate electrode 127 and the trench-based source electrode 128a, normally thermal oxidation is repeated multiple times to form a thick silicon oxide insulating layer. Since thermal oxidation is conducted at a high temperature (approximately ranging from 950° C. to 1150° C.), the top portion of each of the trenches is undesiredly enlarged due to oxidation upon multiple repetitions of thermal oxidation. Thus, the mesa between the adjacent two trenches is reduced. As a result, conducting plugs will be inevitably formed too close to each other. Further, the threshold voltage ($V_{th}$) of the trench power transistor will be adversely affected, thereby increasing the uncertainty of the production method and reducing the favorableness in producing precision components.

In contrast, the method of the present disclosure applies low-pressure chemical vapor deposition at a temperature not higher than 750° C. to form an oxide insulating layer (i.e. the insulating layer 36, in particular, the fourth insulating material 804 intended to form a part of such layer) between the shield electrode 34 and the gate electrode 35. The mesa between the adjacent two electrode trenches 331 can be prevented from being reduced.

Referring back to FIG. 12, when the second embodiment of the trench power transistor shown therein is intended to be produced, a second embodiment of the method according to the present disclosure is used. The second embodiment of the method is similar to the first embodiment, except that the rectifier structure 7 is formed between the adjacent electrode trenches 331 to replace the well 37 and the source 38 between the adjacent electrode trenches 331. Specifically, in step 98, the Schottky conductive plug 71 of the rectifier structure 7 is formed via a through-hole extending through the insulation layer 5 by virtue of metal deposition.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A trench power transistor comprising:
a semiconductor body having a first surface and a second surface opposite to each other, and including at least one active region, said active region including
a trench electrode structure having an electrode trench that is recessed from said first surface, and that has a bottom wall, a lower surrounding wall extending upwardly from said bottom wall, and an upper surrounding wall extending upwardly from said lower surrounding wall to said first surface, said electrode trench having a lower trench portion that is defined by said bottom wall and said lower surrounding wall, and an upper trench portion that is defined by said upper surrounding wall, said trench electrode structure including an insulating layer that is disposed over said bottom wall and said upper and lower surrounding walls, a shield electrode that is disposed in said lower trench portion and that is enclosed by said insulating layer, and a gate electrode that is disposed in said upper trench portion, and that is surrounded by said insulating layer to be separated from said shield electrode,
a well formed adjacent to said electrode trench of said trench electrode structure, and extending downwardly from said first surface, and
a source formed in said well,
wherein said semiconductor body further includes a trench edge termination structure surrounding said active region and having a termination trench that is recessed from said first surface and that has a bottom wall, a lower surrounding wall extending upwardly from said bottom wall of said termination trench, and an upper surrounding wall extending upwardly from said lower surrounding wall of said termination trench to said first surface, said termination trench having a lower trench portion that is defined by said bottom wall and said lower surrounding wall of said termination trench, and an upper trench portion that is defined by said upper surrounding wall of said termination trench, said trench edge termination structure including an insulator layer that is disposed over said bottom wall and said upper and lower surrounding walls of said termination trench, an electrically conductive member that is disposed at least in said lower trench portion of said termination trench, and that is surrounded by said insulator layer, and a nitride layer that is disposed in said upper trench portion of said termination trench, and that is surrounded by said insulator layer to be separated from said electrically conductive member.

2. The trench power transistor as claimed in claim 1, wherein said upper trench portion of said electrode trench has a depth ranging from 0.5 μm to 1.5 μm, and said lower trench portion of said electrode trench has a depth ranging from 0.5 μm to 10 μm.

3. The trench power transistor as claimed in claim 1, wherein an upper end of said shield electrode proximal to said upper trench portion of said electrode trench is apart from said upper trench portion of said electrode trench by a predetermined distance.

4. The trench power transistor as claimed in claim 1, further comprising an insulation layer that covers said first surface and said electrode trench of said semiconductor body, and an electrically conducting unit that is disposed on said insulation layer, said electrically conducting unit including a source conducting plug that is in ohmic contact with said source of said active region, and a gate electrode conducting plug that is in ohmic contact with said gate electrode of said trench electrode structure.

5. The trench power transistor as claimed in claim 1, further comprising an insulation layer that covers said first surface, said electrode trench, and said termination trench of said semiconductor body, and an electrically conducting unit that is disposed on said insulation layer, said electrically conducting unit including a source conducting plug that is in ohmic contact with said source of said active region, a gate electrode conducting plug that is in ohmic contact with said gate electrode of said trench electrode structure, and an edge termination conducting plug that is in ohmic contact with said electrically conductive member of said trench edge termination structure.

6. The trench power transistor as claimed in claim 1, wherein said semiconductor body includes a plurality of said active regions, said semiconductor body further including at least one rectifier structure that is disposed between two adjacent ones of said active regions, said rectifier structure including a Schottky conductive plug that is in Schottky contact with said semiconductor body.

* * * * *